United States Patent
Kim et al.

(10) Patent No.: US 8,727,579 B2
(45) Date of Patent: May 20, 2014

(54) LIGHT EXTRACTION MEMBER AND ORGANIC LIGHT EMITTING DIODE INCLUDING THE SAME

(75) Inventors: Yune-Hyoun Kim, Daejeon (KR); Sang-Choll Han, Daejeon (KR)

(73) Assignee: LG Chem Ltd., Seoul (KR)

( * ) Notice: Subject to any disclaimer, the term of this patent is extended or adjusted under 35 U.S.C. 154(b) by 234 days.

(21) Appl. No.: 13/378,646

(22) PCT Filed: Jun. 17, 2010

(86) PCT No.: PCT/KR2010/003927
§ 371 (c)(1),
(2), (4) Date: Dec. 15, 2011

(87) PCT Pub. No.: WO2010/147414
PCT Pub. Date: Dec. 23, 2010

(65) Prior Publication Data
US 2012/0106169 A1 May 3, 2012

(30) Foreign Application Priority Data

Jun. 17, 2009 (KR) .................. 10-2009-0053956
Jun. 17, 2010 (KR) .................. 10-2010-0057596

(51) Int. Cl.
*F21V 5/04* (2006.01)
*G02B 27/12* (2006.01)

(52) U.S. Cl.
USPC .................. 362/331; 362/335; 359/622

(58) Field of Classification Search
USPC ............... 362/97.1–97.4, 235–237, 244–246, 362/331, 332, 335; 359/621, 622
See application file for complete search history.

(56) References Cited

U.S. PATENT DOCUMENTS

| | | | | |
|---|---|---|---|---|
| 5,839,823 A * | 11/1998 | Hou et al. | ...... | 362/327 |
| 6,079,854 A * | 6/2000 | Ra | ...... | 362/342 |
| 6,402,347 B1 * | 6/2002 | Maas et al. | ...... | 362/294 |
| 6,520,666 B1 * | 2/2003 | Beyerlein et al. | ...... | 362/471 |
| 6,663,784 B1 | 12/2003 | Kummer et al. | | |
| 7,645,056 B1 * | 1/2010 | Mills et al. | ...... | 362/294 |
| 7,740,388 B2 * | 6/2010 | Chang | ...... | 362/606 |
| 2004/0042198 A1 | 3/2004 | Cok | | |
| 2007/0102621 A1 | 5/2007 | Kim | | |
| 2008/0284313 A1 | 11/2008 | Berben et al. | | |

FOREIGN PATENT DOCUMENTS

| | | |
|---|---|---|
| CN | 101322247 | 12/2008 |
| JP | 08-179106 | 12/1996 |
| JP | 2002-538972 | 11/2002 |
| JP | 2004-119583 | 4/2004 |
| JP | 2008-032967 | 2/2008 |
| KR | 10-2005-0063339 A | 6/2005 |
| KR | 10-2005-0103772 A | 11/2005 |
| KR | 10-2008-0026883 A | 3/2008 |

\* cited by examiner

*Primary Examiner* — Alan Cariaso
(74) *Attorney, Agent, or Firm* — McKenna, Long & Aldridge, LLP.

(57) ABSTRACT

A light extraction member includes a plurality of unit lenses arranged on one surface thereof. Each of the unit lenses comprises a combination of two or more kinds of conic lenses.

13 Claims, 1 Drawing Sheet

LIGHT EXTRACTION MEMBER AND ORGANIC LIGHT EMITTING DIODE INCLUDING THE SAME

This application is a National Stage Entry of International Application No. PCT/KR2010/003927, filed Jun. 17, 2010, and claims the benefit of Korean Application Nos. 10-2009-0053956, filed on Jun. 17, 2009, and 10-2010-0057596, filed on Jun. 17, 2010, which are hereby incorporated by reference for all purposes as if fully set forth herein.

TECHNICAL FIELD

The present invention relates to a light extraction member and an organic light emitting diode (OLED) including the same, and more particularly, to a light extraction member, which is designed to significantly reduce total internal reflection of an OLED, and an OLED including the same.

BACKGROUND ART

An OLED is a thin-film LED including a light emission layer formed of an organic compound, and uses the phenomenon of electroluminescence in which a light emission layer emits light when a current flows through the fluorescent organic compound. Such an OLED may be driven at a low voltage and manufactured as a thin film type, and has a wide viewing angle and a rapid response speed. Therefore, even when the OLED is seen from a side, the quality of the OLED is not changed, and an afterimage does not remain on a screen, different from a liquid crystal display (LCD). Furthermore, full coloration may be achieved. Accordingly, the OLED has a great potential to become a leader among the next-generation flat panel display devices.

In general, an OLED includes an anode (ITO layer), a hole injection layer, a hole transport layer, a light emission layer, an electron transport layer, an electron injection layer, and a cathode, which are sequentially stacked on a transparent substrate. When power is supplied thereto, electrons are transferred into the light emission layer by the assistance of the electron transport layer at the cathode, and holes from which a electron is escaped are transferred into the light emission layer by the assistance of the hole transport layer at the anode. The electrons and the holes which join in the light emission layer formed of an organic material generate excitons having high energy. The excitons generate light while the energy of the excitons is lowered.

Meanwhile, such an OLED is known to have low light extraction efficiency. The main reason that the light extraction efficiency is low is the occurrence of total internal reflection in which light is totally reflected into the OLED at the interface between the transparent substrate and the anode (transparent electrode) having a large refractive index or between the transparent substrate and the air. Therefore, in order to substantially prevent such total internal reflection and increase the optical extraction efficiency of the OLED, various methods have been proposed, including forming irregularities on the transparent substrate of the OLED or attaching a cone-shaped light extraction sheet to the transparent substrate. When such methods are used, the light extraction efficiency thereof is somewhat improved. However, the improvement effect is too slight to achieve a sufficient effect.

DISCLOSURE OF INVENTION

Technical Problem

An aspect of the present invention provides a light extraction member, which is designed to significantly reduce total internal reflection within an OLED, and an OLED including the same.

Solution to Problem

According to an aspect of the present invention, there is provided a light extraction member comprising a plurality of unit lenses arranged on one surface thereof. Each of the unit lenses comprises a combination of two or more kinds of conic lenses.

The pitch between the unit lenses may range from 20 to 500 mm. The height of the unit lenses may range from 10 to 100% of the pitch between the unit lenses.

The unit lenses may be arranged in a honeycomb structure.

At this time, each of the unit lenses may include a first conic lens forming the lower part of the unit lens and a second conic lens forming the upper part of the unit lens. The diameter of the bottom surface of the first conic lens may range from 80 to 116% of the pitch between the unit lenses. The diameter of the bottom surface of the second conic lenses may range from 40 to 80% of the diameter of the bottom surface of the first conic lens.

The first conic lens has a lens shape expressed as Equation 1, and the second conic lens has a lens shape expressed as Equation 2.

$$y = H_1 - \frac{x^2/r_1}{1 + \sqrt{1 - (1+k_1)(1/r_1)^2 x^2}} \quad \text{[Equation 1]}$$

Here, $r_1$ represents a curvature radius at a virtual vertex of the first conic lens, $k_1$ represents a conic constant of the first conic lens, and $H_1$ represents a height from the bottom surface of the first conic lens to the virtual vertex.

$$y = H_2 - \frac{x^2/r_2}{1 + \sqrt{1 - (1+k_2)(1/r_2)^2 x^2}} + y_0 \quad \text{[Equation 2]}$$

Here, $r_2$ represents a curvature radius at the vertex of the second conic lens, $k_2$ represents the conic constant of the second conic lens, $H_2$ represents a height from the bottom surface of the second conic lens to the vertex, and $y_0$ represents a height from the bottom surface of the first conic lens to a position where the diameter of the bottom surface of the second conic lens is equalized to the diameter of the cross-section of the first conic lens.

At this time, $r_1$ may range from 0.1 to 200% of the diameter of the bottom surface of the first conic lens, $k_1$ may range from $-25$ to $-1.2$, $r_2$ may have a value different from $r_1$ among values capable of forming a conic curved surface with respect to given conic constants $k_2$.

According to another aspect of the present invention, there is provided an organic light emitting diode (OLED) comprising the light extraction member.

Advantageous Effects of Invention

When the light extraction member according to the embodiment of the present invention is used, the light extraction efficiency of an OLED may be significantly improved. As a result, the energy efficiency and brightness of the OLED may be improved.

BRIEF DESCRIPTION OF DRAWINGS

The above and other aspects, features and other advantages of the present invention will be more clearly understood from the following detailed description taken in conjunction with the accompanying drawings, in which.

BEST MODE FOR CARRYING OUT THE INVENTION

Figure 1:
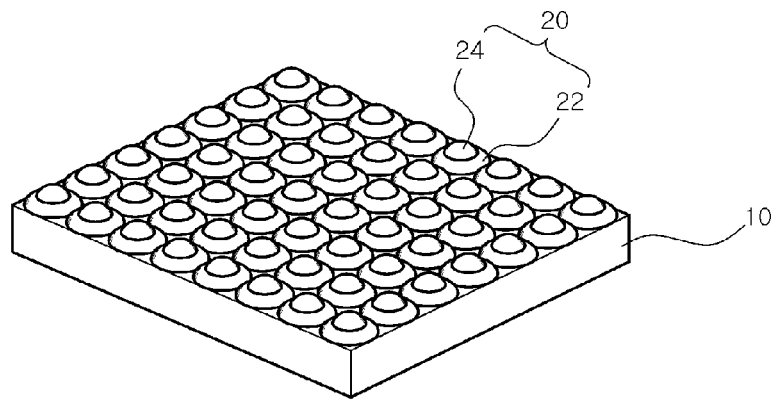
FIG. 1 is a diagram explaining an example of a light extraction member according to an embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals in the drawings denote like elements, and thus their description will be omitted.

FIG. 1 is a diagram illustrating an example of a light extraction member according to an embodiment of the present invention. Referring to FIG. 1, the light extraction member 10 according to the embodiment of the present invention includes a plurality of unit lenses 20 two-dimensionally arranged on one surface thereof.

The unit lens 20 according to the embodiment of the present invention includes a combination of two or more kinds of conic lenses.

Each of the conic lenses refers to a lens formed in a shape having a curved surface. For example, the conic lens may include a hemisphere lens, an elliptical lens, a parabolic lens, a hyperbolic lens and so on. The shape of the conic lens is expressed as a function in which a curvature radius at the vertex of the lens and a conic constant are set to parameters. The curvature radius is usually represented by r, and the conic constant is usually represented by k. In this case, the conic constant k may determine the shape of the lens. When k=0, a circular lens is formed. When k=−1, a parabolic lens is formed. When −1<k<0, an elliptical lens is formed. When k<−1, a hyperbolic lens is formed.

Figure 2:
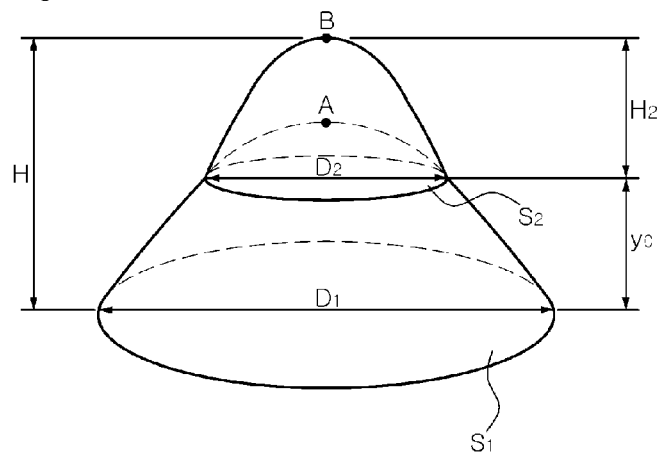
FIG. 2 is a diagram illustrating the structure of a unit lens according to the embodiment of the present invention.

Meanwhile, referring to FIG. 2, two or more conic lenses are combined to form one unit lens 20. More specifically, when two or more conic lenses are combined to form one unit lens, it means that a portion of the unit lens is formed in a shape satisfying a specific lens expression I, another portion of the unit lens is formed in a shape satisfying a specific lens expression II, and another portion of the unit lens is formed in a shape satisfying a specific lens expression III. That is, the respective portions of the unit lens may be composed of conic lenses having different shapes. At this time, the respective portions of the unit lens may be set depending on the height of the unit lens.

FIG. 2 illustrates a case in which two kinds of conic lenses are combined. However, this is only an example according to the embodiment of the present invention, and the present invention is not limited thereto. That is, the unit lens according to the embodiment of the present invention may be formed by a combination of three or more kinds of conic lenses. The above-described unit lens formed by a combination of two kinds of conic lens may be easily manufactured and has an economic advantage.

Meanwhile, the conic lenses forming the unit lens 20 may have different shapes from each other. When the unit lens 20 is formed by a combination of two kinds of conic lenses, the conic lens forming the lower part of the unit lens 20 may be referred to as a first conic lens 22, and the conic lens forming the upper part of the unit lens 20 may be referred to as a second conic lens 24, for convenience of description. In this case, the diameter $D_1$ of the bottom surface of the first conic lens 22 forming the lower part of the unit lens 20 may have different ranges depending on the two-dimensional arrangement form of the unit lenses 20 and/or the pitch P between the unit lenses 20. Considering the purpose of use, the type of a device, and the manufacturability, a designer may properly select the two-dimensional arrangement form of the unit lenses 20 and the pitch P between the unit lenses 20.

Figure 3:
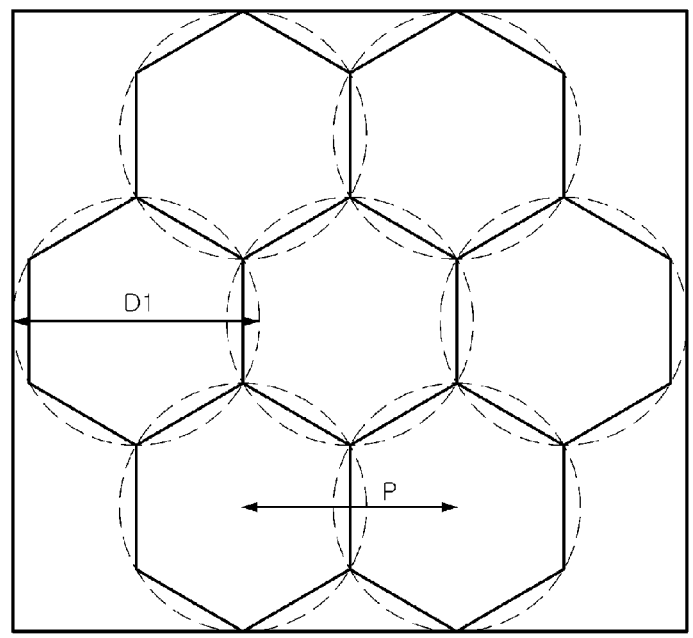
FIG. 3 is a diagram explaining an arrangement example of unit lenses according to the embodiment of the present invention.

The pitch P between the unit lenses 20 according to the embodiment of the present invention may range from 20 to 500 μm. Referring to FIG. 3, the pitch P between the unit lenses 20 refers to a distance between the centers of the bottom surfaces of the neighboring unit lenses. When the pitch P is smaller than 20 μm, there are difficulties in manufacturing a lens mold. When the pitch P is larger than 500 μm, the height and the volume of the lens may increase. Then, the manufacturing cost inevitably increases. Furthermore, the exterior of the lens may be easily recognized, and the uniformity of light distribution may decrease to degrade the exterior quality.

Meanwhile, the two-dimensional arrangement form of the unit lenses is not specifically limited, and a designer may select a proper form. FIG. 3 illustrates an arrangement example of the unit lenses 20 according to the embodiment of the present invention, showing an arrangement state of the bottom surfaces of the unit lenses. Referring to FIG. 3, the unit lenses according to the embodiment of the present invention may be arranged in a honeycomb structure. When the arrangement of the unit lenses has a honeycomb structure, a flat space (referred to as a gap) between the respective lenses may be minimized. The arrangement may exhibit an excellent light extraction effect, compared with other arrangements. Furthermore, although not illustrated, the unit lenses according to the embodiment of the present invention may be arranged in such a manner as to have a slight gap between the lenses.

More specifically, the unit lenses according to the embodiment of the present invention may be arranged in such a manner that the diameter of the bottom surface of the first conic lens ranges from 80 to 116% of the pitch P between the unit lenses, desirably 90 to 116%, or most desirably 100 to 115%. When the diameter of the bottom surface of the first conic lens is smaller than 80% of the pitch P, the flat surface between the lenses may increase. Then, the effect of total reflection caused by the flat surface may increase to reduce the light extraction efficiency. When the diameter of the bottom surface of the first conic lens is larger than 116%, the diameter of the bottom surface of the first conic lens may deviate from the physically possible maximum diameter in the honeycomb structure. According to a simulation result depending on the lens shape, when the diameter D1 ranges from 100 to 115% of the pitch P, excellent light extraction efficiency is exhibited. This range corresponds to such a range that a slight gap exists between the unit lenses 20, and the plane of the gap may act as a positive factor for light extraction.

Meanwhile, the diameter of the bottom surface of the second conic lens may range from 40 to 80% of the diameter of the bottom surface of the first conic lens. When the diameter of the bottom surface of the second conic lens is smaller than 40% or larger than 80%, the improvement in light extraction efficiency by the combination of different kinds of lenses is not exhibited.

The first conic lens 22 forming the lower part of the unit lens according to the embodiment of the present invention may have a lens shape which is expressed as Equation 1 below.

$$y = H_1 - \frac{x^2/r_1}{1 + \sqrt{1 - (1+k_1)(1/r_1)^2 x^2}} \quad \text{[Equation 1]}$$

In Equation 1, when a lens is assumed to satisfy Equation 1, $r_1$ represents a curvature radius at a virtual vertex of the lens, $k_1$ represents a conic constant of a first conic lens, and $H_1$ represents a height from the bottom surface of the first conic lens to the virtual vertex of the lens. At this time, the virtual vertex of the first conic lens may be represented by a point A in FIG. 2. The virtual vertex is not realized in the unit lenses according to the embodiment of the present invention, but indicates a theoretical vertex of the lens expressed as Equation 1.

When the first conic lens is expressed by Equation 1, the curvature radius $r_1$ may range from 0.1 to 200% of the diameter of the bottom surface of the first conic lens, desirably 1 to 35%, or most desirably 1 to 5%. The conic constant $k_1$ may range from −25 to −1.2, desirably −4.5 to −2, or most desirably −4 to −2.5. Here, when the curvature radius $r_1$ of the first conic lens is larger than 200% of the diameter of the bottom surface of the first conic lens, the improvement effect of the light extraction efficiency is not nearly exhibited. When the curvature radius $r_1$ of the first conic lens ranges from 1 to 5% of the diameter of the bottom surface of the first conic lens, the improvement effect is maximized. Meanwhile, when the conic constant $k_1$ is more than −1.2 or less than −2.5, the improvement effect of the light extraction efficiency is not exhibited. When the conic constant $k_1$ ranges from −4 to −2.5, the improvement effect is maximized.

Meanwhile, the second conic lens 24 forming the upper part of the unit lens may have a lens shape expressed as Equation 2 below.

$$y = H_2 - \frac{x^2/r_2}{1 + \sqrt{1 - (1+k_2)(1/r_2)^2 x^2}} + y_0 \quad \text{[Equation 2]}$$

In Equation 2, $r_2$ represents a curvature radius at the vertex B of the second conic lens, $k_2$ represents the conic constant of the second conic lens, $H_2$ represents a height from the bottom surface $S_2$ of the second conic lens to the vertex B, and $y_0$ represents a height from the bottom surface $S_1$ of the first conic lens to a position where the diameter $D_2$ of the bottom surface $S_2$ of the second conic lens is equalized to the diameter of the cross-section of the first conic lens, that is, a height from the bottom surface $S_1$ of the first conic lens to the bottom surface $S_2$ of the second conic lens.

When the second conic lens is expressed as Equation 2, the curvature radius $r_2$ and the conic constant $k_2$ may be set to have different values from the curvature radius $r_1$ and the conic constant $k_1$, respectively. As the difference therebetween gets larger, the effect increases. The curvature radius $r_2$ may be selected as a value different from the curvature radius $r_1$, among values capable of forming a conic curved surface with respect to a relevant conic constants $k_2$. Desirably, the curvature radius $r_2$ may range from 10 to 3000% of the diameter of the bottom surface of the second conic lens, or most desirably 50 to 3000%. The conic constant $k_2$ may have an arbitrary value different from the conic constant $k_1$. Desirably, the conic constant $k_2$ may range from −2.5 to 0, most desirably −2 to 0. When the curvature radius $r_2$ is equal to or larger than 50% of the diameter of the bottom surface of the second conic lens and the conic constant $k_2$ has a value close to 0 in a range having a different value from the conic constant $k_1$, the improvement effect of the light extraction efficiency is excellent.

Meanwhile, the light extraction member 10 according to the embodiment of the present invention may be formed of a transparent material, and the material of the light extraction member 10 is not specifically limited. For example, resin, plastic, glass and so on may be used as the material of the light extraction member 10. The resin may include urethane acrylate, epoxy acrylate, ester acrylate, or radical generation-type monomer. The resins may be independently used or combined and used. The plastic may include polymethylmethacrylate (PMMA), polycarbonate (PC), polystyrene (PS), polyethylene terephtalate (PET) and a copolymer of PMMA and PS. One or more of them may be selected and used as the plastic. The glass may include silica or silicate which is obtained by adding oxide such as $Li_2O$, $B_2O_3$, CaO, $K_2O$ or MgO into $SiO_2$.

A method for manufacturing a light extraction member having the unit lens formed on one surface thereof is well-known to those skilled in the art. Therefore, the method according to the related art may be used. For example, when resin is used, the resin may be injected between a base material and a mold engraved with a desired shape and then cured by using ultraviolet light or heat, in order to manufacture the light extraction member. When plastic or glass is used therefore, an injection molding process may be used, in which molten plastic or glass is injected into an injection mold and then cooled to obtain the light extraction member. Furthermore, when the glass is used, an etching process such as reactive ion etching (RIE) may be used to form the light extraction member.

When the light extraction member according to the embodiment of the present invention is applied to an OLED, the improvement effect of light extraction efficiency is more excellent than when an existing light extraction sheet having a hemispherical shape or polygonal cone shape is used. This is because the structure according to the embodiment of the present invention, which has two or more curved surfaces, effectively reduces a total reflection condition at the interface with the air layer in the light source distribution of the OLED which follows the Lambertian distribution, compared with a lens structure having a single curved surface shape (hemispherical shape) or a polygonal cone shape. This will be described in more detail as follows. Although the lens structure having a hemispherical shape or polygonal cone shape may reduce the total reflection condition at the interface with the air layer more effectively than a flat-surface lens structure, light may be totally reflected along the single curved surface or single slope, or a considerable amount of light may be recycled into a light emission layer or reflecting layer by reflection which substantially corresponds to the total reflection. When the recycled light meets a curved surface or slope having the same shape, it is highly likely that the light may be recycled one more time.

As the amount of recycled light within the OLED increases, the amount of light absorbed in the organic material layer or reflecting layer within the OLED may increase during the recycling. As a result, light loss continuously occurs. Therefore, there is a limit to increasing light extraction efficiency. However, when the unit lens is formed in a shape having two or more different curved surfaces according to the embodiment of the present invention, even light having a total reflection characteristic with respect to a primary curved surface may not have a total reflection characteristic with respect to a secondary curved surface. Furthermore, even light satisfying the total reflection condition with respect to the secondary curved surface may not satisfy the total reflection condition with respect to the primary curved surface. Therefore, it is likely that the recycling number of the light may be reduced in comparison with the unit lens having a single curved surface. As a result, it is possible to increase light extraction efficiency.

The light extraction member according to the embodiment of the present invention may be used in an OLED. In this case, the light extraction member is stacked in such a manner that the opposite surface to a surface having the unit lens formed thereon faces a transparent substrate of the OLED.

MODE FOR THE INVENTION

Hereinafter, the present invention will be described in more detail with reference to specific embodiments.

Embodiment 1

The light extraction efficiency of an OLED was measured, the OLED including an light extraction member in which a plurality of unit lenses each formed by a combination of the first conic lens expressed as Equation 1 and the second conic lens expressed as Equation 2 are arranged two-dimensionally in a honeycomb structure having a pitch P of 50 μm.

At this time, the light extraction efficiency was measured under conditions of $D_1$=52 μm, $D_2$=30.8 μm, $r_1$=1.4 μm, $k_1$=−3.246, $H_1$=16.74 μm, $r_2$=15.4 μm, $k_2$=−0.05, $H_2$=12.59 μm, and $y_0$=7.07 μm.

When the above-described light extraction member including the unit lenses was applied to the OLED, the light extraction efficiency of the OLED was simulated by using a Ray-tracing program (TracePro of Lambda Research Co.). At this time, the simulation condition may be set as follows. The OLED light source was set to have a distribution corresponding to the Lambertian light distribution, and the absorption and reflection characteristics of the reflecting layer were defined by using absorption and reflection characteristics with respect to aluminum. Furthermore, the absorption or scattering characteristics of layers related to the light emission were defined by correcting a measurement result obtained when only a glass substrate is applied without a light extraction member and a simulation result for the measurement result. Furthermore, in order to minimize the reflection at the interface between the glass substrate and the light extraction member, the refractive indexes of the light extraction member and the glass substrate were set to have the same value. The light extraction efficiency from the glass substrate into the air may be calculated as follows. When the total amount of light entered into the glass substrate is assumed to be 100, the amounts of light extracted into the air are considered as the light extraction efficiency.

Embodiment 2

The light extraction efficiency of an OLED was measured in a state in which conditions were set in the same manner as those of Embodiment 1, except for conditions of $D_2$=29 μm, $r_2$=30.5 μm, $k_2$=−1.886, $H_2$=3.29 μm, and $y_0$=7.66 μm.

Embodiment 3

The light extraction efficiency of an OLED was measured under conditions of $D_1$=56 μm, $D_2$=31.92 μm, $r_1$=1.3 μm, $k_1$=−2.997, $H_1$=19.17 μm, $r_2$=15.96 μm, $k_2$=−0.5, $H_2$=9.35 μm, and $y_0$=8.51 μm.

Embodiment 4

The light extraction efficiency of an OLED was measured in a state in which conditions were set in the same manner as those of Embodiment 1, except for conditions of $r_1$=0.01 μm, $H_1$=17.34 μm, and $y_0$=7.07 μm.

Embodiment 5

The light extraction efficiency of an OLED was measured in a state in which conditions were set in the same manner as those of Embodiment 1, except for conditions of $r_1$=100 μm, $H_1$=3.26 μm, and $y_0$=2.09 μm.

Embodiment 6

The light extraction efficiency of an OLED was measured in a state in which conditions were set in the same manner as those of Embodiment 1, except for conditions of $k_1$=−1.2, $H_1$=51.56 μm, and $y_0$=23.42 μm.

Embodiment 7

The light extraction efficiency of an OLED was measured in a state in which conditions were set in the same manner as those of Embodiment 1, except for conditions of $k_1$=−25, $H_1$=5.25 μm, and $y_0$=2.16 μm.

Embodiment 8

The light extraction efficiency of an OLED was measured in a state in which conditions were set in the same manner as those of Embodiment 1, except for conditions of $r_2$=0.308 μm, $k_2$=−1, and $H_2$=385 μm.

Embodiment 9

The light extraction efficiency of an OLED was measured in a state in which conditions were set in the same manner as those of Embodiment 1, except for conditions of $r_2$=308 μm, $k_2$=−1, and $H_2$=0.39 μm.

Embodiment 10

The light extraction efficiency of an OLED was measured in a state in which conditions were set in the same manner as those of Embodiment 1, except for conditions of $k_2$=−1000 and $H_2$=0.47 μm.

Comparative Embodiment 1

The light extraction efficiency of an OLED which does not use a light extraction member was measured in the same manner as in Embodiment 1.

Comparative Embodiment 2

The light extraction efficiency of an OLED including a light extraction member in which hemispherical lenses having a radius of 25 μm are arranged two-dimensionally in a honeycomb structure was measured in the same manner as in Embodiment 1.

Table 1 shows the measurement results of Embodiments 1 to 10 and Comparative Embodiments 1 and 2. In Table 1, a value in parenthesis indicates how much the light extraction efficiency is improved, when the light extraction efficiency of Comparative Embodiment 1 is assumed to be 1.

TABLE 1

|  | Light extraction efficiency (%) |
| --- | --- |
| Comparative Embodiment 1 | 51.6% (1.00) |
| Comparative Embodiment 2 | 79.4% (1.53) |
| Embodiment 1 | 93.0% (1.80) |
| Embodiment 2 | 92.0% (1.78) |
| Embodiment 3 | 94.0% (1.82) |
| Embodiment 4 | 82.8% (1.60) |
| Embodiment 5 | 80.0% (1.55) |
| Embodiment 6 | 80.7% (1.56) |
| Embodiment 7 | 80.1% (1.55) |
| Embodiment 8 | 80.8% (1.57) |
| Embodiment 9 | 93.4% (1.81) |
| Embodiment 10 | 93.4% (1.81) |

Referring to Table 1, it can be seen that when the light extraction member according to the embodiment of the present invention is used, the light extraction efficiency may be improved by 55% to 82%, compared with Comparative Embodiment 1. Furthermore, the light extraction efficiency may be improved by 2% to 29%, compared with Comparative Embodiment 2.

While the present invention has been shown and described in connection with the exemplary embodiments, it will be apparent to those skilled in the art that modifications and variations can be made without departing from the spirit and scope of the invention as defined by the appended claims.

The invention claimed is:

1. A light extraction member comprising a plurality of unit lenses arranged on one surface thereof,
wherein each of the unit lenses comprises a first conic lens forming a lower part of the unit lens and a second conic lens forming an upper part of the unit lens; and
wherein the first conic lens has a lens shape expressed as [Equation 1], and the second conic lens has a lens shape expressed as [Equation 2]:

$$y = H_1 - \frac{x^2/r_1}{1 + \sqrt{1 - (1+k_1)(1/r_1)^2 x^2}} \quad \text{[Equation 1]}$$

where $r_1$ represents a curvature radius at a virtual vertex of the first conic lens, $k_1$ represents a conic constant of the first conic lens, and $H_1$ represents a height from the bottom surface of the first conic lens to the virtual vertex, and $$y = H_2 - \frac{x^2/r_2}{1 + \sqrt{1 - (1+k_2)(1/r_2)^2 x^2}} + y_0 \quad \text{[Equation 2]}$$

where $r_2$ represents a curvature radius at the vertex of the second conic lens, $k_2$ represents the conic constant of the second conic lens, $H_2$ represents a height from the bottom surface of the second conic lens to the vertex, and $y_0$ represents a height from the bottom surface of the first conic lens to a position where the diameter of the bottom surface of the second conic lens is equalized to the diameter of the cross-section of the first conic lens.

2. The light extraction member of claim 1, wherein the pitch between the unit lenses ranges from 20 to 500 μm.

3. The light extraction member of claim 1, wherein the height of the unit lenses ranges from 10 to 100% of the pitch between the unit lenses.

4. The light extraction member of claim 1, wherein the unit lenses are arranged in a honeycomb structure.

5. The light extraction member of claim 1, wherein the diameter of the bottom surface of the first conic lens ranges from 80 to 116% of the pitch between the unit lenses.

6. The light extraction member of claim 1, wherein the diameter of the bottom surface of the second conic lenses ranges from 40 to 80% of the diameter of the bottom surface of the first conic lens.

7. The light extraction member of claim 1, wherein $r_1$ ranges from 0.1 to 200% of the diameter of the bottom surface of the first conic lens.

8. The light extraction member of claim 1, wherein $k_1$ ranges from −25 to −1.2.

9. The light extraction member of claim 1, wherein $r_2$ has a different value from $r_1$.

10. The light extraction member of claim 9, wherein $r_2$ ranges from 50 to 3000% of the diameter of the bottom surface of the second conic lens.

11. The light extraction member of claim 1, wherein $k_2$ has a different value from $k_1$.

12. The light extraction member of claim 11, wherein $k_2$ ranges from −2.5 to 0.

13. An organic light emitting diode (OLED) comprising the light extraction member of claim 1.

* * * * *